United States Patent [19]

Kurashima

[11] Patent Number: 5,237,220
[45] Date of Patent: Aug. 17, 1993

[54] MASTER-SLICE TYPE ECL CIRCUIT
[75] Inventor: Yasumi Kurashima, Tokyo, Japan
[73] Assignee: NEC Corporation, Tokyo, Japan
[21] Appl. No.: 833,852
[22] Filed: Feb. 6, 1992
[30] Foreign Application Priority Data Feb. 6, 1991 [JP] Japan .................................. 3-14652

[51] Int. Cl.$^5$ ................ H03K 19/086; H03K 19/173
[52] U.S. Cl. ..................................... 307/467; 307/475; 307/455
[58] Field of Search ...................... 307/467, 455, 296.3, 307/455

[56] References Cited

U.S. PATENT DOCUMENTS

| | | | |
|---|---|---|---|
| 4,506,173 | 3/1985 | Yum | 307/467 |
| 4,514,650 | 4/1985 | Yum | 307/467 |
| 4,633,104 | 12/1986 | Mallinson | 307/467 |
| 5,029,280 | 7/1991 | Yee et al. | 307/465.1 |

Primary Examiner—Edward P. Westin
Assistant Examiner—Richard Roseen

[57] ABSTRACT

A master-slice type emitter coupled logic circuit includes a first and a second inverter circuit and a two-input AND circuit which receives output signals from the first and second inverter circuits. Each of the first and second inverter circuits has an emitter follower circuit having a level shift circuit and an emitter follower transistor whose collector is connected to a higher potential power source, whose base receives a logic signal, and whose emitter is coupled to a lower potential power source. The emitter of the emitter follower transistor in the first inverter circuit is coupled to the lower potential power source through only a load resistor, whereas that in the second inverter circuit is coupled to the lower potential power source through the level shift circuit and the load resistor. The level shift circuit is formed by at least one diode whose anode is to be connected with the emitter of the emitter follower transistor and whose cathode is to be connected with one end of the load resistor. The outputs of the first and second inverter circuits are directly inputted to the two-input AND circuit. According to this arrangement, such an input emitter follower circuit for level shifting as was present in a conventional multi-input AND circuit can be omitted, resulting in the saving of power consumption more than 20%.

3 Claims, 3 Drawing Sheets

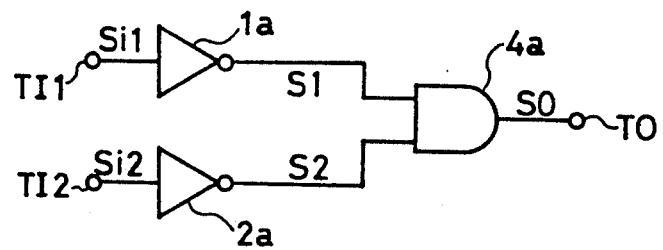
FIG. 1A
PRIOR ART
FIG. 1B
PRIOR ART
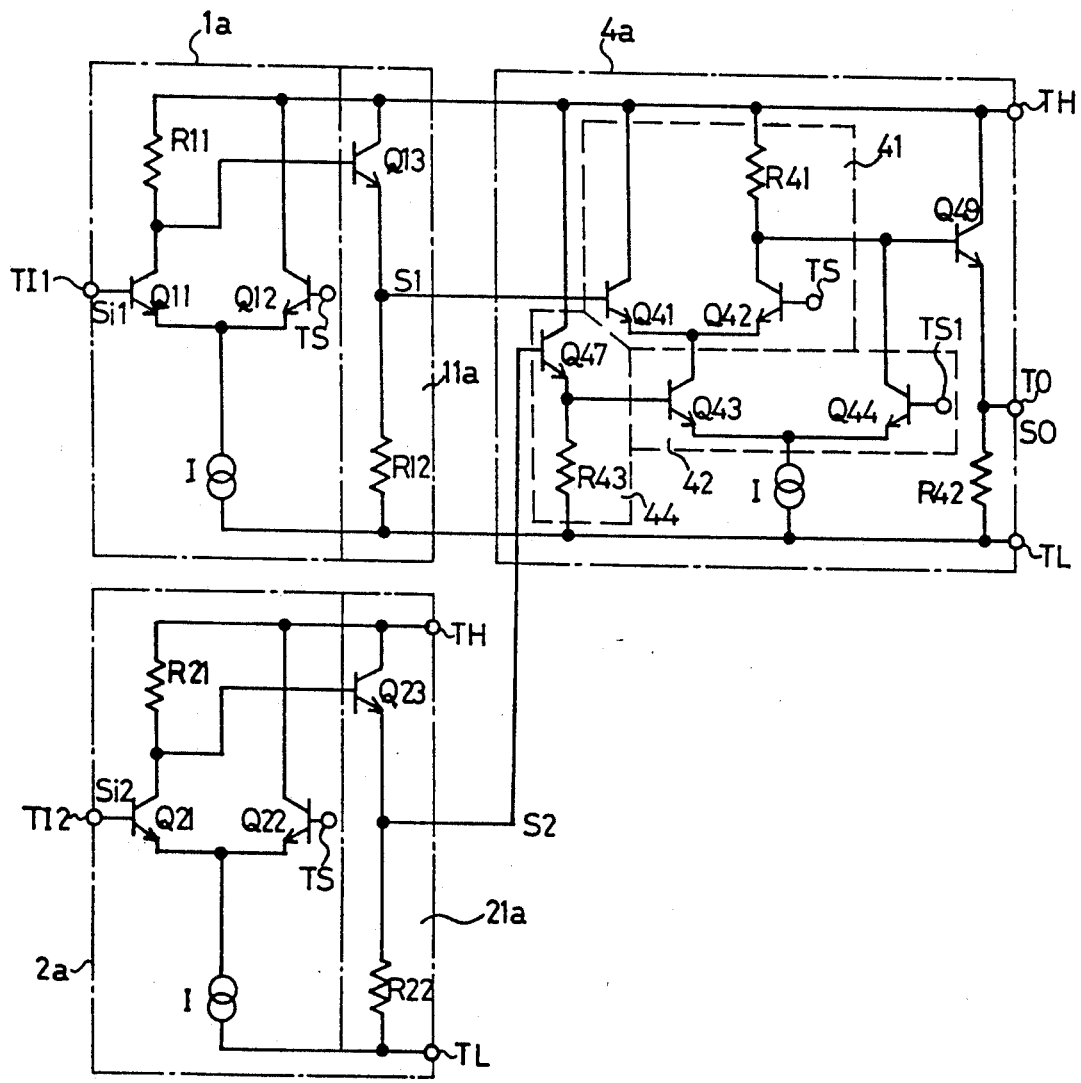

MASTER-SLICE TYPE ECL CIRCUIT

BACKGROUND OF THE INVENTION (1) Field of the Invention

The present invention relates to an Emitter Coupled Logic circuit (hereinafter referred to as an "ECL circuit") of a master-slice type and, more particularly, to an emitter follower circuit formed in such master-slice type ECL circuit.

(2) Description of the Related Art

In a conventional master-slice type ECL circuit of the type to which the present invention relates, where a logic circuit for taking a logical AND operation on output signals S1, S2 of two inverters 1a, 2a as shown in FIG. 1A is to be formed, the circuit configuration used is as shown in FIG. 1B. That is, since the levels of the input signals Si1, Si2 applied to input terminals TI1. TI2 of the inverter circuits 1a, 2a are the same as the level of the output signal S0 of a two-input AND circuit 4a, the signal S2 to be inputted to an ECL circuit 42 which is arranged at a side of a lower potential terminal within the two-input AND circuit 4a is supplied through a level shifting circuit 44 arranged at a top stage of the AND circuit 4a. The same is true for a third stage of a three-input AND circuit having three ECL circuit stages arranged in a staked relation. These are disclosed as ECL gate array internal circuits, for example, in "The Aspect Gate Array Design Manual" 10-2, 10-3, 10-4, 1988 of the National Semiconductor Corporation, and also disclosed as ECL gate array internal circuits, for example, in the "Macrocell Arrays MCA2500ECL Design Manual" (pages 5-6), 1985 of Motorola, Inc.

In the above conventional master-slice type ECL circuit, where the logic circuit is to be formed by two or more stacked stages of ECL circuits, it is necessary to provide a potential difference in the order of a forward voltage of one diode in each of the logic levels in each of the logic circuits and, in order to maintain the input signal level of the ECL circuit and the output signal level thereof at the same level, the logic input signal(s) to be inputted to a given stage(s) of the multi-stage differential logic section within the logic circuit is(are) level-shifted through a level shift circuit(s). This means that the power consumed is large which results in an increase in the power consumption in the overall ECL circuit. This is a problem to be solved.

SUMMARY OF THE INVENTION

It is, therefore, an object of the invention to overcome the problems existing in the conventional ECL circuit and to provide an improved master-slice type ECL circuit.

It is another object of the invention to provide a master-slice type ECL circuit wherein power consumption is reduced.

According to one aspect of the present invention, there is provided a master-slice type ECL circuit which comprises:

a first emitter-follower circuit including a first level shift circuit, a first emitter resistor and a first transistor which has a base receiving a first input signal, a collector connected to a higher potential power source, and an emitter connected directly to a first output node for outputting a first output signal and connected to a lower potential power source through the emitter resistor;

a second emitter-follower circuit including a second level shift circuit, a second emitter resistor and a second transistor which has a base receiving a second input signal, a collector connected to the higher potential power source, and an emitter connected to a second output node for outputting a second output signal through the second level shift circuit and connected to the lower potential power source through the second level shift circuit and the second emitter resistor; and a multi-input logic circuit for taking a predetermined logical operation on the first and second output signals from the first and second emitter follower circuits, which has a higher potential stage ECL circuit having a differential pair of third and fourth transistors one of which receives at its base the first output signal from the first emitter follower circuit; and a lower potential stage ECL circuit having a differential pair of fifth and sixth transistors one of which receives at its base the second output signal from the second emitter follower circuit, the first and second ECL circuits being arranged in a stacked relation between the higher and lower potential power sources.

BRIEF DESCRIPTION OF THE DRAWINGS

The above and other objects, features and advantages of the present invention will be apparent from the following description of preferred embodiments of the invention explained with reference to the accompanying drawings, in which:

FIG. 1A is a block diagram of an example of a conventional master-slice type ECL circuit;

FIG. 1B is a detailed circuit diagram showing a conventional master-slice type ECL circuit;

PREFERRED EMBODIMENTS OF THE INVENTION

Now, preferred embodiments of the present invention will be explained with reference to the accompanying drawings. It should be noted that, throughout the following explanation, similar reference symbols or numerals refer to the same or similar elements in all the figures of the drawings.

Figure 2:
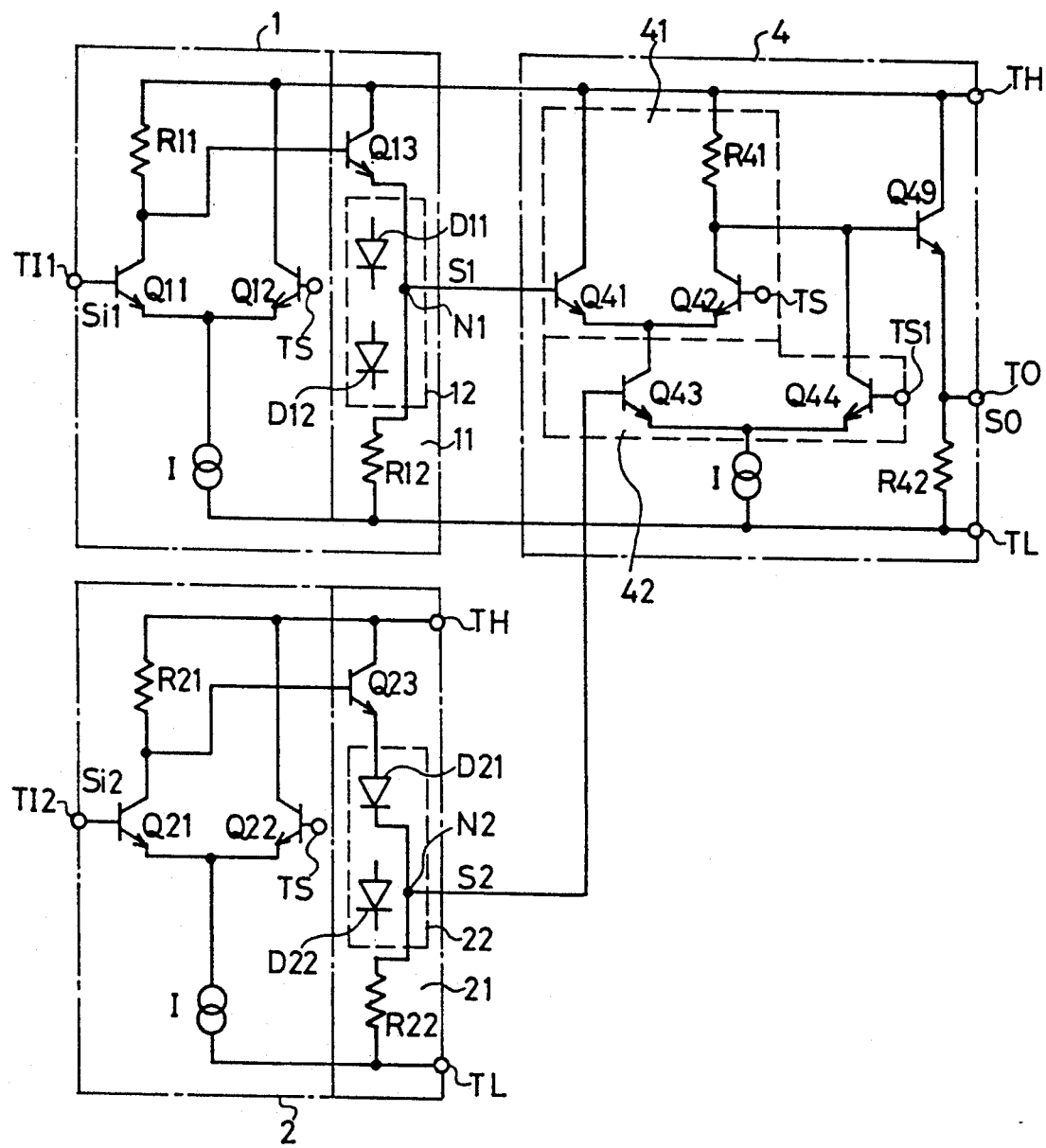
FIG. 2 is a detailed circuit diagram showing an ECL circuit of a first embodiment according to the present invention.

First, FIG. 2 diagrammatically shows a master-slice type ECL circuit of a first embodiment according to the invention. The ECL circuit of this embodiment is formed by first and second inverter circuits 1, 2, and a two-input AND circuit 4 which receives each of the output signals S1, S2 of the first and second inverter circuits.

The inverter circuit 1 has a pair of differential current-switching transistors Q11, Q12, a load resistor R11, a constant-current source I, and an emitter follower circuit 11 which includes an output transistor Q13, a load resistor R12, and a level shift circuit 12 consisting of two diodes D11, D12. The transistor Q11 receives at its base an input signal S11 and the transistor Q12 receives at its base a reference voltage applied to a reference potential terminal TS. The inverter circuit 2 has the same circuit configuration as that of the above first inverter circuit 1, with a pair of differential current-switching transistors Q21, Q22, a load resistor R21, a constant current source I, and an emitter follower circuit 21 which includes an output transistor Q23, a load resistor R22 and a level shift circuit 22 consisting of two diodes D21, D22. The two-input AND circuit 4 has a first ECL circuit 41 which is arranged at a side of a higher potential terminal TH and includes a pair of differential current-switching transistors Q41, Q42 and a common load resistor R41; a second ECL circuit 42 which is arranged at a side of a lower potential terminal TL and which has a pair of differential current-switching transistors Q43, Q44; a constant-current source I; and an output emitter follower circuit formed by an output transistor Q49 and a load resistor R42. As clearly shown in the drawings, the first and second ECL circuits 41 and 42 have a stacked relation. An output signal S0 is derived from an output terminal T0 of the AND circuit 4.

Here, since the output signal S1 from the first inverter 1 is inputted to a base of the transistor Q41 in the first ECL circuit 41, it is outputted from an output node N1 of an emitter follower circuit 11 only with the resistor R12 as a transistor load resistance being used and without the level shift circuit 12 having the diodes D1 and D2 being used. On the other hand, since the output signal S2 of the second inverter circuit 2 is inputted to a base of the transistor Q43 of the second ECL circuit 42 in the two-input AND circuit 4, it is outputted from the emitter follower circuit 21 with the level shift circuit 22 being used. More specifically, the output signal S2 is outputted from a node N2 of a common junction point of the diode D21 and the resistor R22. An anode of the diode D21 used is connected with an emitter of the transistor Q23 and a cathode thereof is connected with the node N2, and the resistor R22 is connected between the node N2 and the lower potential terminal TL.

Since the voltage level of the output signal S2 of the second inverter circuit 2 is level-shifted as a result of the voltage being lowered by that corresponding to a forward voltage of one diode (D21), it is possible to input directly the output signal S1 of the first inverter circuit 1 to the base of the transistor Q41 which is the input terminal of the first ECL circuit 41 in the two-input AND circuit 4 and also to input directly the output signal S2 of the second inverter circuit 2 to the base of the transistor Q43 which is the input terminal of the second ECL transistor 42 of the same two-input AND circuit 4. Thus, unlike in the conventional master-slice type ECL circuit explained above with reference to FIG. 1B, it is unnecessary to level-shift the input signal S2 supplied to the second ECL circuit 42 by using the level shift circuit 44 in the two-input AND circuit 4a and it is possible to save or reduce the consumption of power otherwise to be consumed by the level shift circuit 44.

Assuming that, in the conventional master-slice type ECL circuit shown in FIG. 1B, the number ratio of the input level shift circuit, the constant-current source and the emitter follower circuit is 1:2:2 and the current ratio thereof is 1:1:1, it is possible to achieve the reduction of approximately 20% in the power consumption by this embodiment of the invention.

Figure 3:
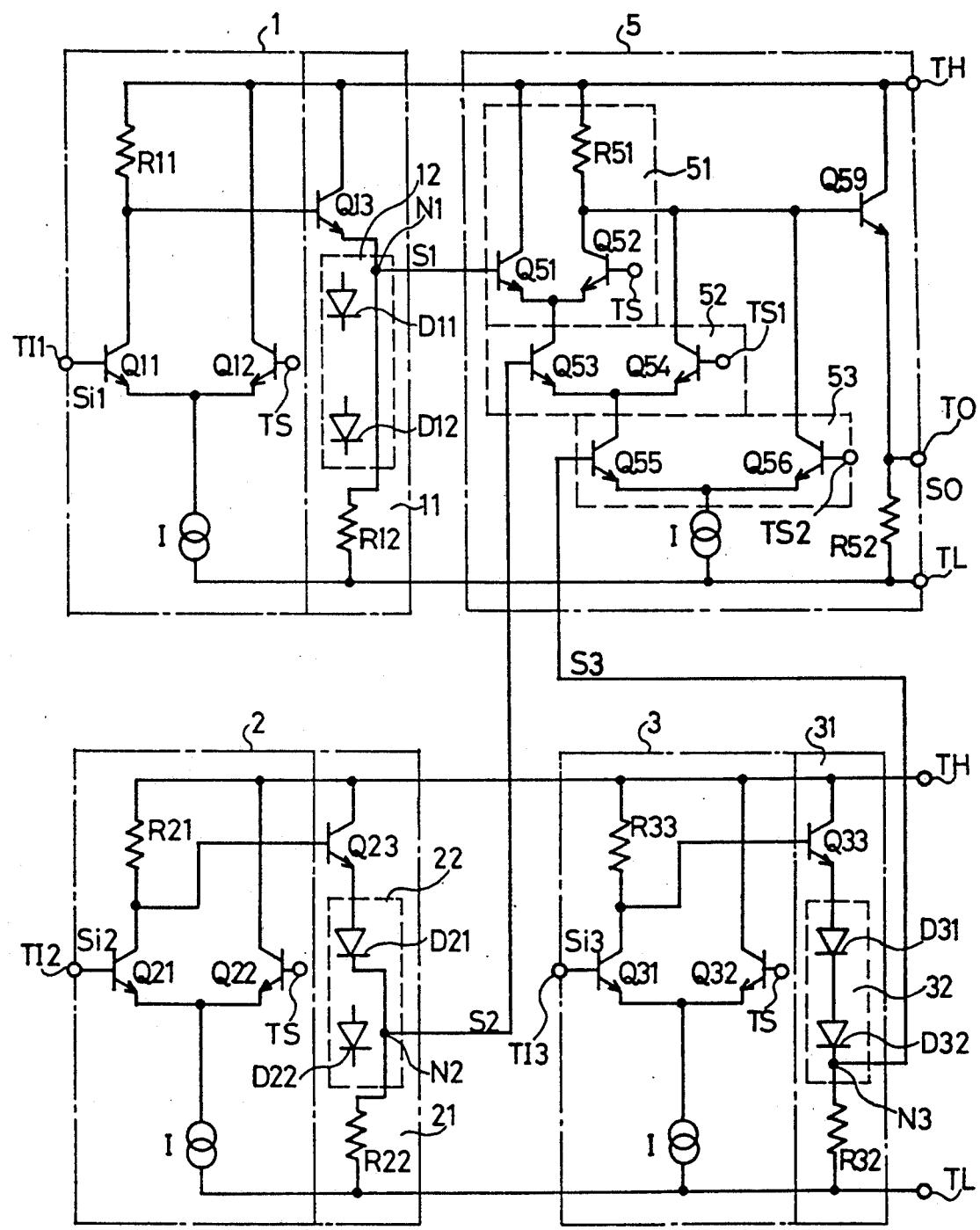
FIG. 3 is a detailed circuit diagram showing an ECL circuit of a second embodiment according to the present invention.

Next, FIG. 3 diagrammatically shows an ECL circuit of a second embodiment according to the invention. The ECL circuit of this embodiment includes in addition to the arrangement in the first embodiment a third inverter circuit 3. The basic arrangement of the third inverter circuit 3 is the same as that of the first or second inverter circuit 1, 2. As the AND circuit 5 of this embodiment is constituted as a three-input AND circuit, there is provided a third ECL circuit 53 which is arranged at the lowest position, that is, between the second ECL circuit 52 and the lower potential terminal TL, and which has a pair of differential current-switching transistors Q55 and Q56. This third stacked ECL circuit 53 receives an output signal S3 from the third inverter circuit 3.

The output signal S3 of the third inverter circuit 3 is outputted from a node N3 in the emitter follower circuit 31 of the inverter circuit 3, which is a common junction point between two serially connected diodes D31, D32 and a resistor R32. An anode of the series diodes D31, D32 is connected with the emitter of the transistor Q33 and a cathode thereof is connected with the node N3, and the resistor R32 is connected between the node N3 and the lower potential terminal TL.

Since the voltage level of the output signal S3 of the third inverter circuit 3 is level-shifted as a result of the level being lower than that of the output signal S1 of the first inverter circuit 1 by the voltage level equivalent to the forward voltages of the two diodes (D31 and D32) connected in series, it is possible to input directly the output signal S1 of the first inverter circuit 1 to the input terminal, i.e., the gate of the transistor Q51, of the first stage ECL circuit 51 in the three-input AND circuit 5 and also to input directly the output signals S2, S3 of the second and third inverter circuits 2, 3 respectively to the bases of the transistors Q53 and Q55 of the stacked second and third ECL circuits 52, 53, respectively. According to this embodiment, since the output signals S2, S3 of the second and third inverter circuits 2, 3 can be directly inputted to the corresponding second and third stage ECL circuits 52, 53 without involving the internal level-shifting of the signals inputted to the three-input AND circuit 5, it is possible to achieve a further saving of the power consumption as compared with that in the first embodiment shown in FIG. 2.

As has been explained hereinabove, a master-slice type ECL circuit according to the present invention has a circuit configuration wherein, among a plurality of emitter follower circuits of the driving side circuits (inverter circuits), at least one emitter follower circuit is so arranged that at least one diode is connected between the emitter of the emitter follower transistor and the output terminal of the emitter follower circuit with an anode terminal of the diode connected to the emitter, and the plurality of emitter follower circuits thus arranged are controlled by the reference potentials of the load side circuit (a multi-input AND circuit) and the output levels of the driving side circuits are switched. According to this arrangement, the input level-shift emitter follower circuit of the top stage within the multi-input AND circuit as present in a conventional circuit can be omitted, so that the power consumed may be reduced more than about 20%.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A master-slice type ECL circuit comprising:
   a first emitter-follower circuit including a first level shift circuit, a first emitter resistor and a first transistor which has a base receiving a first input signal, a collector connected to a higher potential power source, and an emitter connected directly to a first output node for outputting a first output signal and connected to a lower potential power source through said emitter resistor;

a second emitter-follower circuit including a second level shift circuit, a second emitter resistor and a second transistor which has a base receiving a second input signal, a collector connected to the higher potential power source, and an emitter connected to a second output node for outputting a second output signal through said second level shift circuit and connected to the lower potential power source through said second level shift circuit and said second emitter resistor; and a multi-input logic circuit for taking a predetermined logical operation on said first and second output signals from said first and second emitter follower circuits, which has a higher potential stage emitter coupled logic circuit having a differential pair of third and fourth transistors one of which receives at its base said first output signal from said first emitter follower circuit; and a lower potential stage emitter coupled logic circuit having a differential pair of fifth and sixth transistors one of which receives at its base said second output signal from said second emitter follower circuit, said first and second emitter coupled logic circuits being arranged in a stacked relation between the higher and lower potential power sources.

2. A master-slice type ECL circuit according to claim 1, in which said first level shift circuit includes at least one diode which is to be connected in a forward direction between the emitter of said first transistor and said first output node, and said second level shift circuit includes at least one diode which is to be connected in a forward direction between the emitter of said second transistor and said second output node.

3. A master-slice type ECL circuit according to claim 1, in which said first through sixth transistors are all NPN type bipolar transistors.

* * * * *